(12) United States Patent
Kuttner et al.

(10) Patent No.: US 9,379,883 B1
(45) Date of Patent: Jun. 28, 2016

(54) DIGITAL TO ANALOG CONVERTER CELL FOR SIGNED OPERATION

(71) Applicant: Intel Corporation, Santa Clara, CA (US)

(72) Inventors: Franz Kuttner, St. Ulrich (AT); Michael Fulde, Drobollach (AT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/571,531

(22) Filed: Dec. 16, 2014

(51) Int. Cl.
*H04L 27/00* (2006.01)
*H04L 7/00* (2006.01)
*H03M 1/66* (2006.01)
*H04L 1/22* (2006.01)

(52) U.S. Cl.
CPC .............. *H04L 7/0083* (2013.01); *H03M 1/66* (2013.01); *H04L 1/22* (2013.01)

(58) Field of Classification Search
CPC ......... H04L 7/0083; H04L 1/22; H03M 1/66; H03M 1/68; H03M 1/001; H03M 1/004
USPC .......... 375/316, 346–348, 350; 341/126–127, 341/144, 150
See application file for complete search history.

(56) References Cited

U.S. PATENT DOCUMENTS

| 5,327,134 A * | 7/1994 | Nakamura | H03M 1/685 341/118 |
| 2007/0080838 A1* | 4/2007 | Asayama | H03M 1/0863 341/144 |
| 2009/0015454 A1* | 1/2009 | Sugai | H03M 1/1019 341/144 |
| 2013/0251068 A1* | 9/2013 | Boos | H04L 27/00 375/302 |
| 2014/0105255 A1 | 4/2014 | Kuttner | |
| 2014/0146913 A1 | 5/2014 | Kuttner et al. | |
| 2014/0146914 A1* | 5/2014 | Kuttner | H03M 1/66 375/295 |
| 2014/0266834 A1* | 9/2014 | Bruennert | H03M 1/685 341/145 |
| 2014/0328429 A1 | 11/2014 | Kuttner et al. | |

OTHER PUBLICATIONS

European Search Report, Application No. 15193990.7-1805, Dated May 3, 2016.

* cited by examiner

*Primary Examiner* — Khanh C Tran
(74) *Attorney, Agent, or Firm* — Eschweiler & Associates, LLC

(57) ABSTRACT

A communication system receives an inputs signal and generates a converted output signal. A control signal selectively activates one or more source cells among an array of cells. The selected source cells generate a first charge package and a second charge package at a cell output terminal for the array of cells to generate the converted output signal. The first charge package and the second charge package are generated during the same clock cycle.

21 Claims, 12 Drawing Sheets

DIGITAL TO ANALOG CONVERTER CELL FOR SIGNED OPERATION

BACKGROUND

Signals are often processed in one format and converted to another for multiple different applications. For example, digital signals can be converted to analog signals, or analog signals can be converted to digital signals. In wireless communication systems these signals can then be mixed with a local oscillator signal to obtain a signal with a desired frequency, such as an analog signal converted from a digital input. In wireless transmitters signals are processed digitally at a baseband frequency, converted to an analog signal via a digital to analog converter (DAC), and mixed with a radio frequency (RF) signal to obtain a radio frequency transmit signal, which is then transmitted via an antenna.

Unfortunately, some converter structures are susceptible to "glitches" and other timing imperfections. This can be due to small differences in path lengths and/or capacitances. For example, when DACs are used in high-frequency applications such as wireless communication one or more glitches or signal spurs can occur. In extreme cases, these glitches can lead to errors in transmitted or received signals. In less extreme cases where the glitches are essentially self-correcting transients, the glitches can still cause excess power consumption due to the current and voltage excursions.

DETAILED DESCRIPTION

Figure 1:
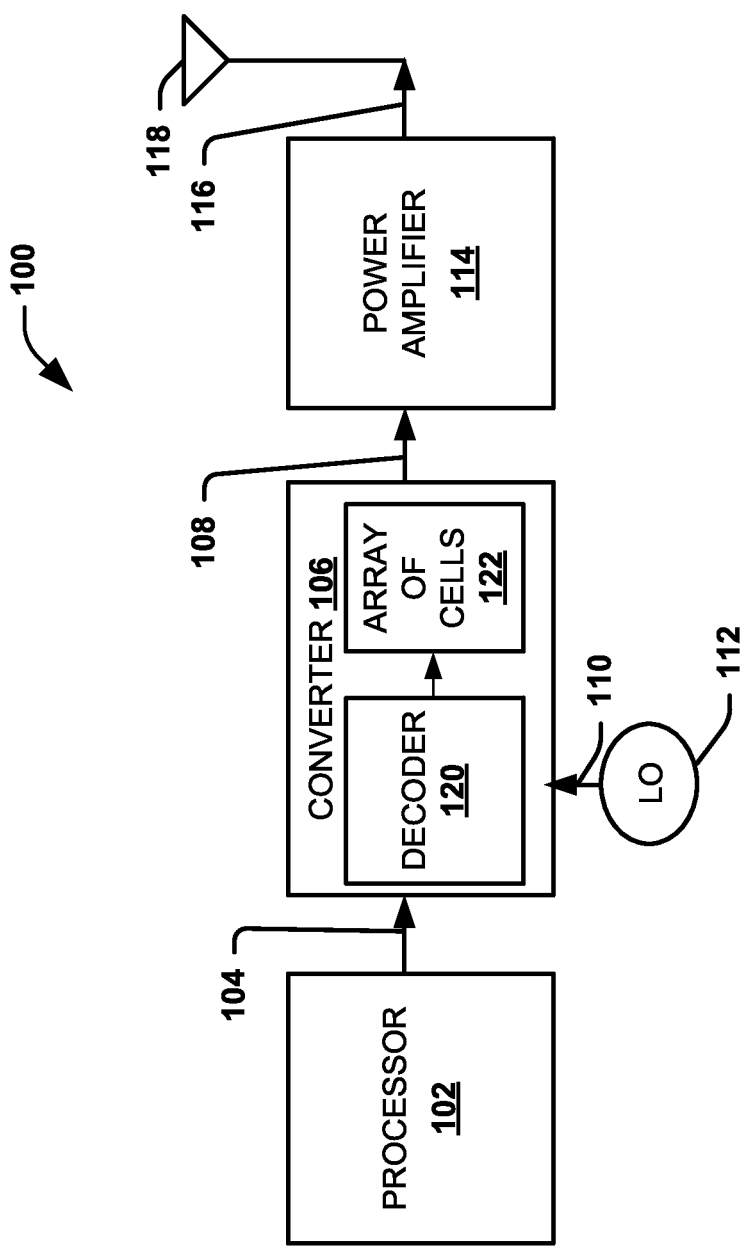
FIG. 1 illustrates a block diagram of a communication system that includes an improved converter device in accordance with various aspects.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a circuit, a processor, a process running on a processor, a controller, an object, an executable, a program, a storage device, a computer, a tablet PC and/or a mobile phone with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

In consideration of the above described deficiencies, a signal conversion system operates to convert an analog signal to a digital signal or a digital signal to an analog signal according to various aspects disclosed. In one aspect, a digital-to-analog converter (DAC) converts a digital signal (e.g., a multi-bit signal) to an analog signal. The number of bits present in the digital signal corresponds to a number of discrete values between which the analog signal varies—the greater the number of bits present, the larger the number of discrete values for the analog signal. For example, for a 5 Volt (V) system, an eight bit digital signal can represent 256 (i.e., $2^8$) different voltage values; where voltage values range from a minimum of 0V to a maximum of 5V with 254 voltage steps in between, wherein each voltage step is spaced at 5/255 V from neighboring voltage steps. Thus, by varying the input signal supplied to a DAC, analog signals output by the DAC vary in a piecewise continuous manner, and can operate as analog signals because of their analog character. Analog signals as provided by a DAC can either be voltage signals (signals in the voltage domain), or current signals (signals in the current domain).

In another aspect, the analog signal output of the DAC can be generated from an array of DAC source cells, which can be referred to as source cells or cell units that actively combine to generate an output. Additionally, the number of source cells that are activated can vary according to the digital input signal. Each source cell of the array can operate as a voltage or a current source to facilitate the generation of the number of discrete values for the analog signal based on the received digital input by the DAC. The source cells in the array can be independently selected according to a control word generated by a decoder component, which derives the control words from the received digital inputs. Each source cell can be independently activated by an enable signal (as the control word or control signal) and a local oscillator signal.

In addition, the source cells are configured to operate with a sign operation, or a bipolar sign operation, in which the sign is an indication of a polarity or a direction (e.g., a positive signal and a negative signal, or a non-inverted signal and an inverted signal). The source cells of the DAC overcome unwanted disadvantages that accompany phase shifting operations for indicating a sign shift or operation. In an aspect of the disclosure, the source cells comprise a first driver chain or branch and a second driver chain or branch that are coupled together to generate a first charge package (e.g., a first signal source) and a second charge package (e.g., a second signal source) to provide a source cell output or a unit cell output within the array. Rather than just phase shifting the amplitude of a single charge package that is output by each source cell, the system operates to generate a sign operation by time shifting the first signal source and the second signal source by shifting the generated charge packages of each source cell as a function of time to indicate the sign (e.g., a polar shift) or a sign operation shift. Additional aspects and details of the disclosure are further described below with reference to the figures.

Turning to the figures, FIG. 1 illustrates an example of a communication system that operates to generate a converted signal with a source cell array in accordance with various aspects. The system 100 comprises a processor 102 such as a digital signal processing (DSP) circuitry or a baseband processor, in which signals are processed to be transmitted. The processor 102 can provide a transmit signal 104 to a converter 106, which receives the transmit signal 104 as an input (e.g., a digital input) and converts the digital transmit signal 104 to a mixed signal 108 of a different format or type such as an analog current signal derived from a digital current signal or vice versa. The converter 106 further mixes the transmit signal 104 with a local oscillator (LO) signal 110 from a local oscillator 112 to output the mixed signal 108. A power amplifier 114 amplifies the mixed signal 108 to provide an amplified mixed signal 116, which is provided to the antenna 118 for wireless transmission.

The converter 106 further includes a decoder 120 and an array of source cells 122. The source cells 122 within the array can include signal sources (e.g., current sources or voltage sources) that are selectively triggered based on one or more control signals (control word, enable signal or an oscillator modulated input) generated by the decoder 120. In particular, the control signals are based on the transmit signal 104 or digital input signals, for example, such that the number of signal sources that deliver current to an output terminal 108 of the converter 106 correspond to the value of the transmit signal 104 at a given time.

To limit glitches and other timing imperfections (e.g. signal spurs), the decoder 120 can modulate one or more of the control signals with the LO signal 110 received from the LO 112. Because the one or more control signals to the array of cells 122 are modulated with the LO signal, the current sources in the array 122 tend to exhibit fewer current/voltage excursions, and the resultant signal 108 at the output of the converter 106 is able to dynamically alter based on the input signal 104 with an increase in specificity or accuracy without glitches, which can otherwise result from timing imperfections due to small differences in path lengths and/or capacitances in the converter 106. In extreme cases, these glitches can lead to errors in transmitted or received signals. In less extreme cases where the glitches are essentially self-correcting transients, the glitches can still cause excess power consumption due to the current and voltage excursions, and thus shortening the useful lifetime of the communication system 100.

Figure 2:
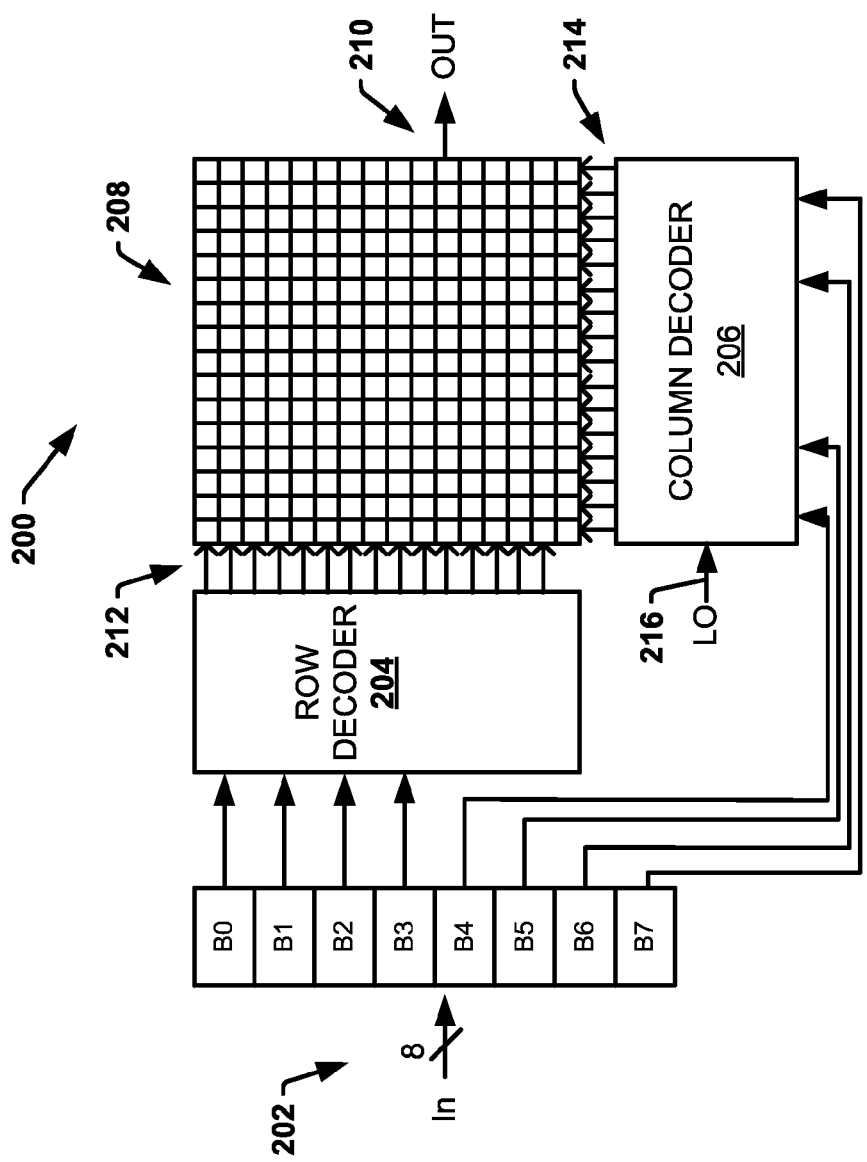
FIG. 2 illustrates a block diagram of a DAC that utilizes control signals for an array of source cells in accordance with various aspects.

Referring to FIG. 2, illustrated is a DAC 200 (e.g., corresponding to one example of the converter 106) according to various aspects. The DAC 200 includes an input 202, row and column decoders 204, 206, a source cell array 208, and an output 210. The column and row decoders 204, 206 provide control signals in the form of row and column thermometer encoded control signals (212, 214, respectively), wherein at least one of the control signals is modulated based on a LO signal 216. Although FIG. 2 shows an example where the LO signal 216 is provided to the column decoder 206 such that at least one column thermometer control signal 214 is LO-modulated, the LO signal 216 can alternatively be provided to the row decoder 204 such that at least one row thermometer control signal 212 is LO modulated.

In one example, input 202 can receive a digital input signal, which can comprise one or more bits. The digital input signal at the input 202 can be a multi-bit digital signal in the form of an eight bit signal, for example, in which the bits are denoted as B0 to B7. Bits B0 to B3, for example, can operate as the least significant four bits and are provided to a row decoder 204, which can be a thermometer row decoder or other row decoder, for example. The bits B4 to B7, for example, can be operate as the most significant four bits and are provided to the column decoder 206, which can be a thermometer column decoder or other column decoder, for example. The decoders 204, 206 are configured to control cell array 208 as a function of a control word generated by the decoders. The cell array 208, for example can comprise $2^8$, or 256, cells as in the present example, but other numbers of cells can also comprise the array 208. The decoders 204, 206 generate a control signal based on the digital input signal or word 202 and select the cells within the array to activate with the control signal or word. In response to being activated by the control signal from the decoders 204, 206, a signal source (e.g., a current or voltage source) within each source cell of cell array 208 outputs a predetermined signal amplitude. In one aspect, the predetermined signal amplitude output by a cell is approximately equal to or the same as that of each other cell. The signal amplitudes (e.g., current amplitude or voltage amplitude) from the number of individual activated cells are summed together to generate analog output signal 210. The cell array 208 alters this analog output signal 210 as a result of the control signals changing as a function of the input signal 202.

For example, the number of activated cells in array 208 depends on the eight bit value B0 to B7. For example, if a digital value of 0000_0000 (corresponding to a decimal value of zero) is set for B0-B7 and applied to the input 202, no cell in cell array 208 is activated and the output current on the output 210 is zero. On the other hand, if all bits are set (i.e., B0-B7 are set to a digital value of 1111_1111, corresponding to a decimal value of 255), all cells in the cell array 208 are activated to yield an output signal 210, which essentially is 256 times stronger than the output of a single cell. Based on a changing of the value of the multi-bit input signal provided to input 202 of the DAC 200, the decoder facilitates the generation of a corresponding analog output signal on output 210.

In another aspect, the row and column decoders 204, 206 can provide row and column thermometer encoded control signals to cell array 208. For example, synchronization circuitry (not shown) in the column decoder 206 can modulate the column control signals 214 provided to the cell array 208 based on a local oscillator (LO) signal 216. This synchronization circuitry, for example, can also be included in the row decoder 204 in other implementations. In alternative arrangements, the row control signals 212 can be modulated with the LO signal 216, rather than the column control signals 214 being LO modulated as illustrated. In still other implementations, both the row and column control signals could be LO-modulated.

Figure 3:
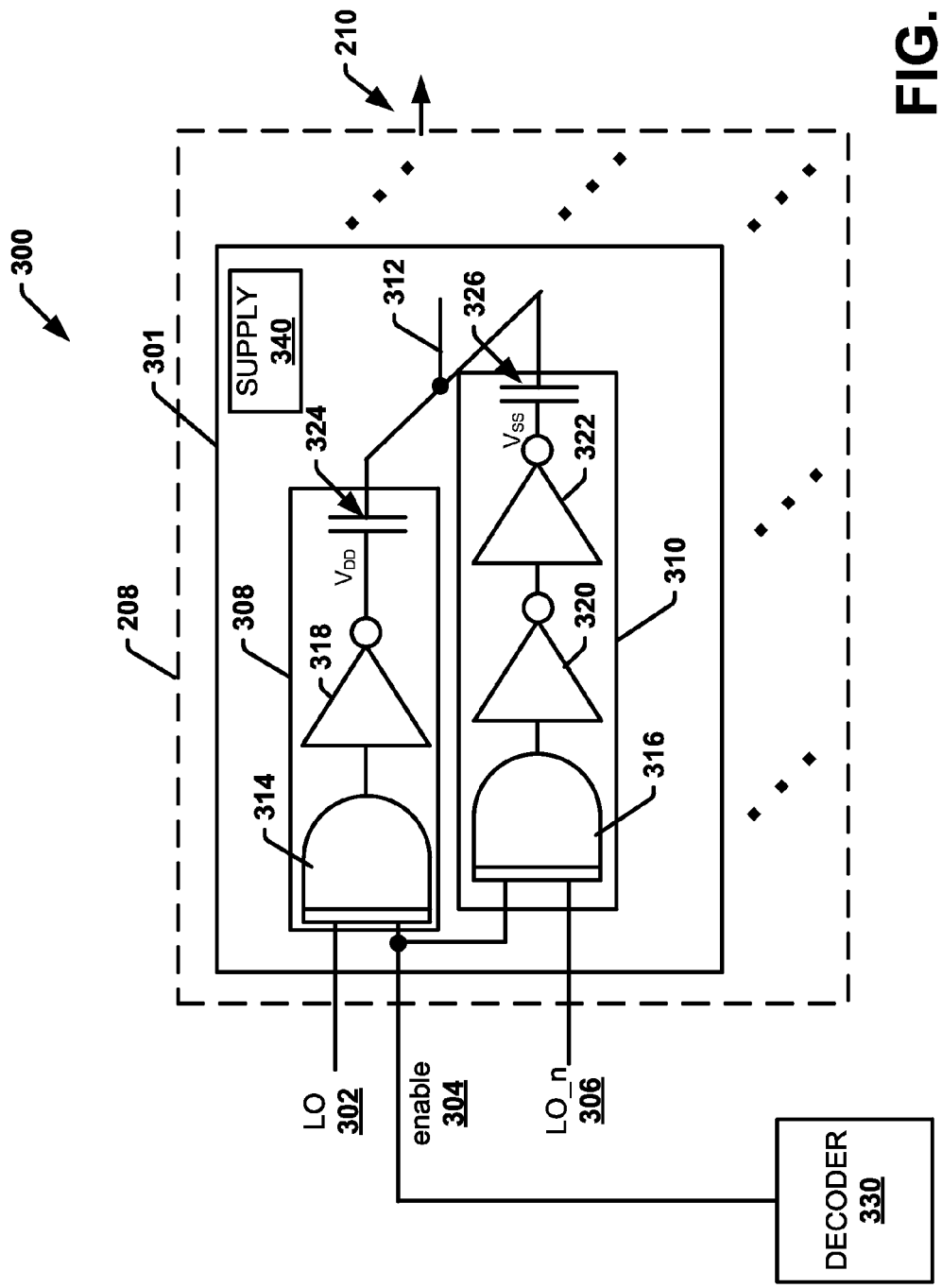
FIG. 3 illustrates a block diagram of an example source cell of a DAC in accordance with various aspects.

Referring to FIG. 3, illustrated is an example source cell 301 of the array of source cells 208 of a converter system 300 according to various aspects being described. The source cell 301 of the array 208 operates to generate a signal source (e.g., a voltage or current source) for a conversion of an input signal into a different format (e.g., a digital inputs signal to an analog output). The source cell 301, for example, is configured to operate in response to a first portion of a local oscillator signal 302, a second portion of the local oscillator signal 306, and an enable signal 304. The source cell 301 can be independently selected and activated within the array of source cells 208 in response to a changing input (e.g., a digital input). As an amplitude of an input to the system 300 changes, for example, so does the number of cells (e.g., 208) change that are selected and activated to produce a similar or same amplitude in the output 210 of the array 208.

The source cells 301 of the array 208 comprise a first signal/charge/driver chain or branch 308 and a second signal/charge/driver chain or branch 310 (referred to herein as signal branches respectively) that operate to generate a signal source at a same output terminal or node 312. The first signal branch 308 comprises a first logic device 314 (e.g., an AND device or other logic device) that is coupled to a first input 302 configured to receive a first local oscillator signal (LO), which is non-inverted in comparison to a second local oscillator signal 306 (LO_n). The first logic device 314 also comprises a second input 304 configured to receive an enable signal that can be derived from a decoder 330 as a control word/signal (enable) based on a received digital input signal. In response to receiving the control signal 304 and a first start edge of the local oscillator signal 302, the first branch 314 becomes selected and is activated to generate a first charge package (e.g., a unit of voltage, a unit of current, a unit of capacitance, an electrical charge, or the like).

The first logic device 314 can be an AND device or other such logic device (e.g., OR device, XOR, NAND, etc.) that operates to activate the source cell 301 in response to the enable signal 304 and/or the local oscillator signal 302. For example, when the LO signal 302 and the enable signal 304 are received at the first branch 308, the first branch 308 provides a control signal to the inverter 318 such that a first capacitor 324, which is coupled to the inverter 318, releases a charge to the output 312 in response.

Just as the first signal branch 308 is selected and activated by the local oscillator signal 302 and enable signal 304, the second signal branch 310 is also concurrently, or at approximately the same time selected within the array 208. The second signal branch 310 is activated within the same source cell 301 during a same data cycle or a same oscillator period of the oscillator signal 302 as the first signal branch 308. Thus, both the first and the second signal branches 308, 310 are activated in the same local oscillator cycle or a same data cycle. In one example, the second signal branch 310 is activated or enabled in response to a second half or a second portion of the local oscillator signal, while the first signal branch 308 is activated in response to a different portion of the local oscillator signal within the same cycle or period. The second half or portion of the local oscillator signal can be an inverted portion of the signal as compared to the first portion of the local oscillator signal, which is a non-inverted portion that activates the first signal branch 308.

The second signal branch 310 also comprises a logic device 316 (e.g., an AND device or other logic device) that provides a control signal to second inverters 320 and 322 for driving a second capacitor 326. In response to the control signal from the inverters (driving stage), the second capacitor 326 provides a second charge package (e.g., a unit of voltage, a unit of current, a unit of capacitance, an electrical charge, or the like).

The second signal branch 310 is coupled to the same enable terminal 304 as the first signal branch 308 and is activated by the enable signal 304 and an inverted local oscillator signal (LO_n) terminal 306. When both the LO_n signal 306 and the enable signal 304 are received at the second branch 310, a control signal is provided to the inverters 320 and 322 such that the second capacitor 326 releases a charge (a second branch charge packet) to the output 312.

The first charge package generated by the first signal branch 308 can be approximately equal in amplitude to the second charge package or source package of the second signal branch 310. The first charge package and the second charge package are provided at the cell output terminal 312 and together generate a capacitance with a first sign designation (e.g., a positive, a negative, a first polarity or a second polarity, etc.). Together the two charge packets can further increase or double the clock of the source cell or the resolution time (e.g., each branch comprising a 2 GHz operation and combining for a 4 GHz operation or a different frequency of operation), for example.

In addition, the source cell 308 can further generate the capacitance or charge with the first charge package and the second charge package having different sign designations, such as with a second sign designation that is different from a first sign based on a shift in time of the first charge package and the second charge package. Thus, the source cell 308 can generate a signed operation or a distinction in a sign change in the output 312 as a first polarity or a second polarity (e.g., a bipolar sign or a positive and a negative indication) without changing an amplitude or generating a phase shift in the outputs of the respective signal branches 308, 310. As such, the amplitude of the source charges from the first capacitor 324 and the second capacitor 326 can be shifted by the cell in a time domain to generate the sign operation.

Figure 4:
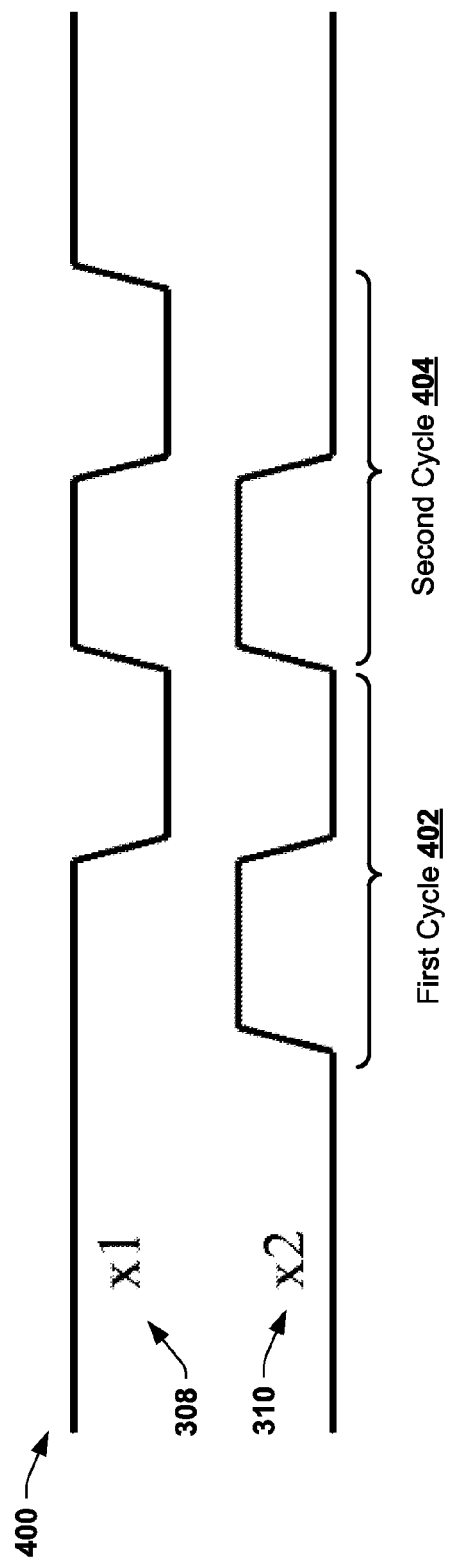
FIG. 4 illustrates example waveforms in accordance with various aspects of the systems described herein.

Referring to FIG. 4, illustrated is an example embodiment of wave forms 400 of signals x1 and x2 that correspond to the first signal branch 308 and the second signal branch 310, respectively. The waveforms 400 are sampled, for example, from the bottom plates of the capacitors 324 and 326. The first waveform x1 that is derived from the first signal branch 308 is illustrated as having an amplitude that is approximately the same as the second waveform x2 derived from the second signal branch 310. The waveforms 400 illustrate that the first waveform x1 is generated at a different starting point than the second waveform x2. For example, a bottom plate or node of the capacitor 324 of the first signal branch is at $V_{DD}$ of supply 340 when the source cell 301 is deactivated, while the second capacitor 326 of the second signal branch 310 is at $V_{SS}$ of the supply 340 when the source cell 301 is deactivated. The source cell 301 is activated during a data cycle or a local oscillator signal of a local oscillator clock. A first data cycle 402 operates to generate source signals from the first signal branch 308 and the second signal branch 310. A second data cycle 404 occurs from another independent selection signal (control signal/word) of the source cell 301 in the array 208 at a different, second data cycle 404, for example, in which both signal branches 308 and 310 operate. Thus, the first signal branch 308 and the second signal branch 310 activate concurrently in the same local oscillator signal cycle or within a same data cycle.

At each sample of the digital input signal, the number of activated source cells of the source cells array 208 corresponds to an amplitude that corresponds to, or is indicated by the digital input signal. In addition, each of the activated source cells further activate corresponding first signal branch(es) 308 and second signal branch(es) 310 in the source cell array 208 in a same cycle 402, which occurs before a same/different number of source cells in the array are activated again during another cycle 404. Each cycle or clock period can be indicated by a local oscillator, for example, such that the first branch 308 of the source cell 301 can be activated in a first half or a first portion of a cycle period and the second branch 310 can be activated by the source cell 301 during a second half or a second portion of the cycle period.

Figure 5:
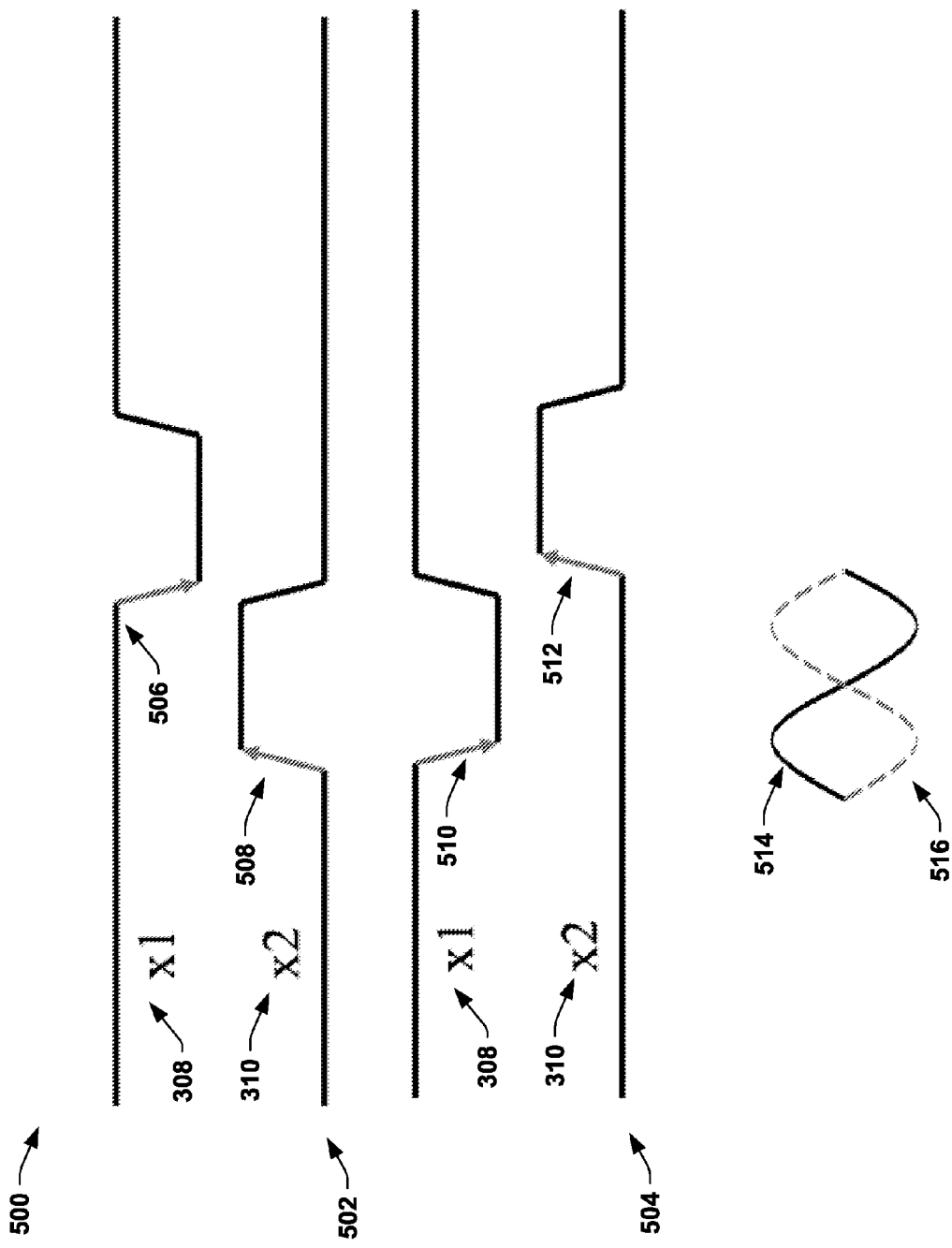
FIG. 5 illustrates additional example waveforms in accordance with various aspects of the systems described herein.

Referring to FIG. 5, illustrated are further aspects of waveforms 500 that are similar to the waveforms 400 of FIG. 4. The first signal branch 308 and the second signal branch 310 activate concurrently in the same local oscillator signal cycle or a same data cycle, as discussed above. In addition, each capacitor 324 and 326 of the source cell 301 is coupled to a different starting point 506, 508 or terminal of a supply 340 (e.g., a voltage source or other source of charge). For example, a bottom plate of the first capacitor 324 can be coupled to a drain voltage terminal $V_{DD}$ of the supply 340 while the second capacitor 326 can be coupled to a supply voltage terminal $V_{SS}$ of the supply 340. For example, a rising edge 508 can facilitate the discharge of the capacitor 326 during a first data cycle, while a falling edge 506 can facilitate the discharge of the capacitor 324 during the same data cycle. The bottom plate of each capacitor 324 and 326 can therefore be coupled to different starting points or terminals of the same supply voltage 340. Additionally or alternatively, the first signal branch 308 can provide a first charge package from the capacitor 324 in response to a falling edge 510 and the second signal branch 326 can provide a second charge package from the capacitor in response to a falling edge 512. Conversely, the first signal branch 308 can respond in a similar manner to a rising edge and the second signal branch 310 to a falling edge, in which the embodiments being described are not limited to any one particular example.

In another aspect, the waveforms 502 and the waveforms 504 differ from one another with a shift in time, and thus provide different sign operations. The waveforms 502 can be generated in a first data cycle of a local oscillator signal and generate a first sign operation/sign difference (e.g., a first polarity or a positive sign), while the waveforms 504 correspond to a different sign operation/sign difference (e.g., a second polarity or negative sign). By shifting the sequences in time relative to prior or future operations, a sign operation can be generated by the systems or devices disclosed. The outputs of the differences in sign can enable the converter 106 (e.g., ADC) to generate approximately continuous signals 514, 516 of different polarities or inversions, in which signal waveform 514 is an inverted (e.g., 180 degree shift differential) signal with respect to the non-inverted signal waveform 516, or vice versa, for example.

The source cells of the array 208 are thus configured to generate two packages of charge for one digital data cycle. The array 208 operates based on one or more input signals to generate a sign operation (an inversion of the signal), in which the charge packages are shifted in time. An inversion of the signal or the sign operation can be approximately equivalent to a 180 degree phase of the RF signal. As a result of the architectures disclosed, there is no difference in an average strobe time for the two charge packages for the inverted and the non-inverted signal, and unwanted spurs are further eliminated/mitigated from being produced when inverting the sign value. Further, having different starting points can provide various advantages. For example, no common mode signal is being generated to the source cell array(s) 208, which prevents unwanted glitches or spurs at a DC voltage. In addition, an unwanted phase shift to provide a sign operation/sign change is avoided, in which no digital processing of the input signal is performed to compensate for a frequency spectrum degradation. Furthermore, an inherent linear interpolation occurs between two samples of the converter with a double clock or frequency range in each source cell of the array 208, which helps to filter repetition images, for example.

The end result of the activation of the cell 301 is that the current at the output 312 is a summation of the first signal branch 308 and a second signal branch 310, while the end result of activating a number of source cells of the array 208 is that the output 210 of the converter (e.g., DAC) is again a summation of signal source packages or charges from the number of cells that are individually and selectively activated. Again, this number of selected cells varies as a function of the digital input being received. As a desired amplitude changes based on indications by the received digital input, then the selected number of source cells of the array 208 changes to generate a corresponding analog output signal that is proportional or comparable to the received digital input signal.

Figure 6:
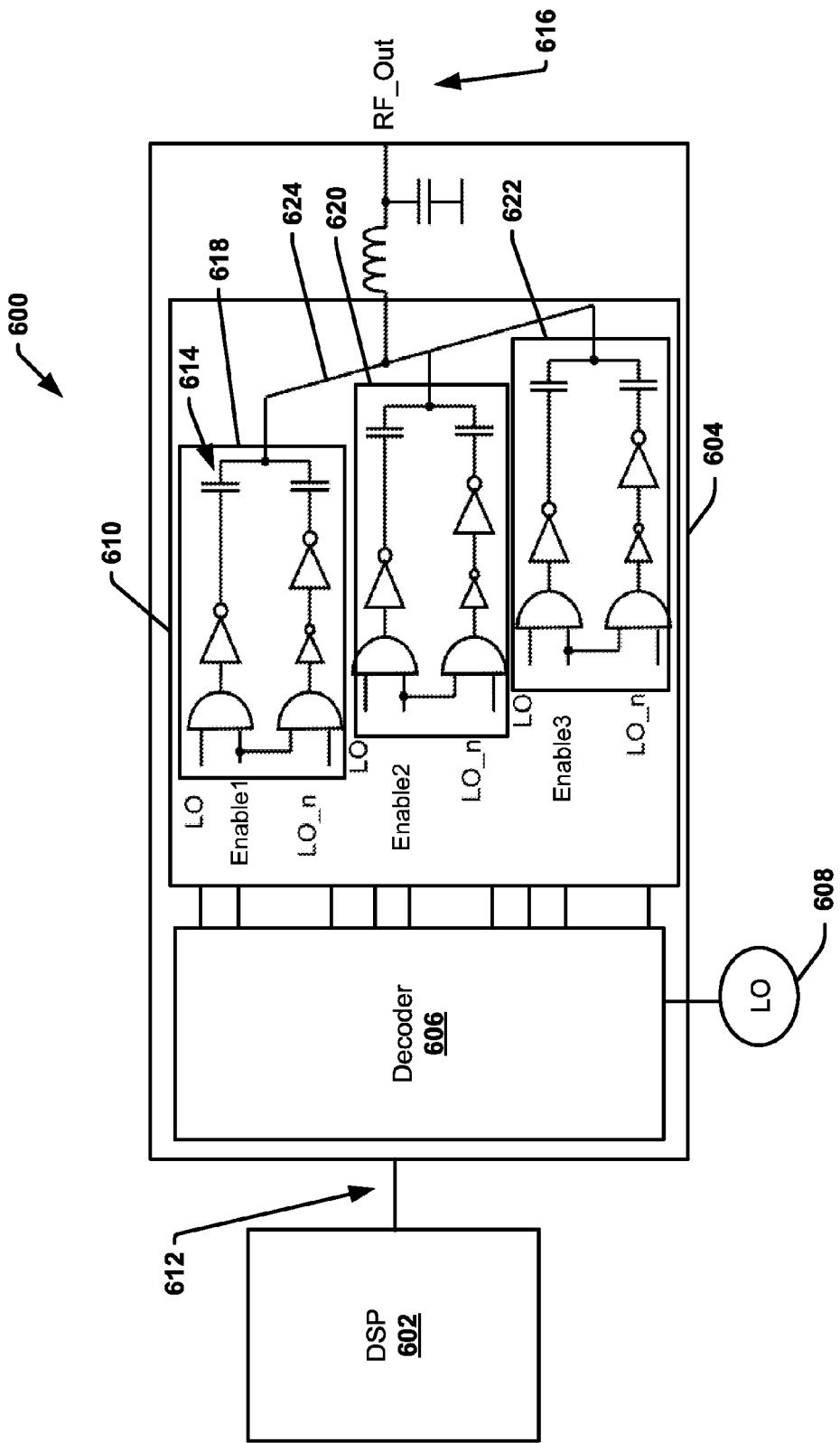
FIG. 6 illustrates an example of a capacitive DAC system in accordance with various aspects of the systems described herein.

Referring now to FIG. 6, illustrated is an example of a capacitive DAC system 600 comprising a capacitive DAC 604 in accordance with various aspects described herein. Unit capacitors 614 within an array of source cells 610 act as the current sources for the capacitive DAC 604, for example. The capacitive DAC system 600 includes a digital signal processor 602 or other controller, a digital input 612, a decoder 606, a source cell array 610, and an analog output 624 coupled to an output 616 (e.g., an RF output) of the DAC 604. Digital input 612 can be a serial or parallel bus arranged to receive a multi-bit digital signal, which is fed to decoder 606. Control lines couple the decoder 606 to respective source cells 618, 620, 622, for example, within source cell array 610, in which the source cells include respective discharge trigger elements (e.g., inverters) and respective capacitors 614. In one aspect, the capacitors 614 each have the same or an approximately similar unit capacitance value, such that each capacitor 614 outputs an equal predetermined current when triggered by its corresponding discharge trigger element or inverter. The currents from any individually activated capacitors 614 are summed on a source cell node of each source cell and at an array output terminal or node as a current summing path 624, which is coupled to analog output 616. Although FIG. 6 only illustrates three cells for simplicity, it will be appreciated that a larger or a different number of cells can be included in array 610, which can be arranged in columns and rows as a two dimensional matrix or in columns, rows and layers as a three dimensional matrix, for example.

During operation of the capacitive DAC system 600, the number of capacitors 614 from which current discharge is triggered at any given time (and corresponding output current on analog output terminal 624) depends on the digital input 612 supplied on input 612. For example, consider an example where the digital input 612 is an eight bit digital value, and wherein the array 610 includes 255 cells. In such a case, a digital value of 0000_0000 (corresponding to a decimal value of zero) can be applied to the input 612, causing all discharge trigger elements to be off (i.e., no current is discharged from capacitors and the output current on output 624 is essentially zero). On the other hand, a digital value of 1111_1111, corresponding to a decimal value of 255) can be applied to the input 612, causing all discharge trigger elements to be activated triggering current discharge from all 255 unit capacitors. Thus, the digital value of 1111_1111 provides an output signal 624 which essentially is 255 times stronger than the output of a single capacitor. By changing the value of the multi-bit input signal provided to input 612 of capacitive DAC 600, a controller (e.g., DSP 602) can deliver a corresponding analog output signal on output 624 (e.g., for transmission over an antenna or other component).

In another aspect, the decoder component 606 is configured to generate a first source cell output and a second source cell output at each source cell output node/terminal of a number of activated source cells 618, 620 or 622, in which the first cell output can be inverted with respect to the second cell output. Different sign operations can be facilitated by the decoder 606 via the first charge branch and the second charge branch of each source cell 618, 620, 622 of the number of activated source cells in the array 610 by shifting the charge packets of each cell in time (instead of by phase) with respect to a past or future operation of the same cell. For example, the decoder 606 generates a first sign operation (e.g., a non-inverted signal of a plurality of charge packages) that is different from a second sign operation (e.g., an inverted signal of a plurality of charge packages) based on a shift in time of both charge packages from a source cell (e.g., source cell 618, 620, or 622).

Figure 7:
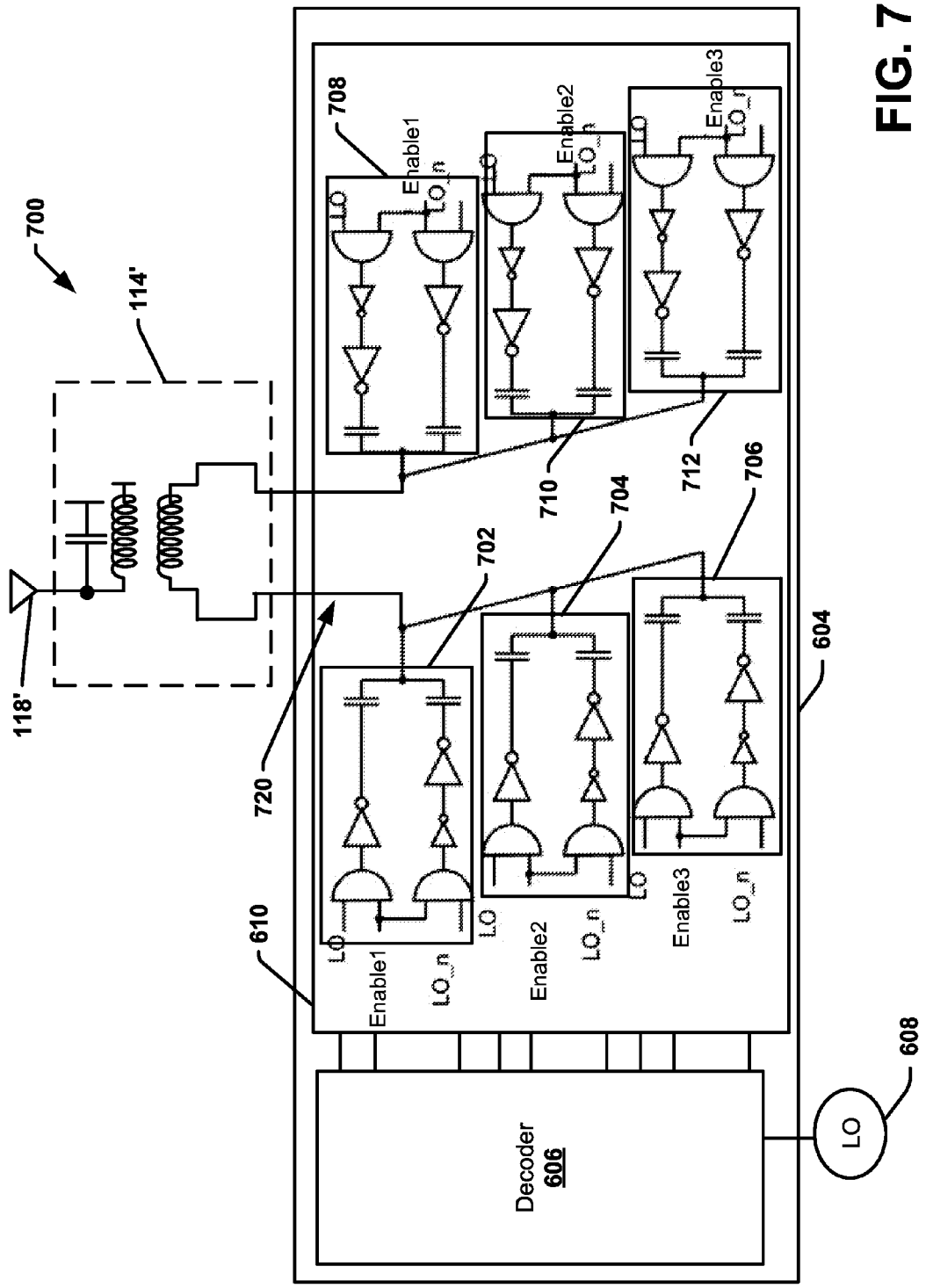
FIG. 7 illustrates another example of a source cell for a capacitive DAC system in accordance with various aspects of the systems described herein.

Referring to FIG. 7, illustrated is an example of a capacitive DAC 700 having a differential output terminal 720. The source cell array 610 can be configured to receive local oscillator signals (LO and LO_n) an enable signal from the decoder 606 and the local oscillator 608 at each data cycle. Any number of the source cell pairs of the array 610 can be selected and activated to generate two charge packages corresponding to each source cell, such as source cells 702 and 708, 704 and 710, or 706 and 712, for example.

Figure 8:
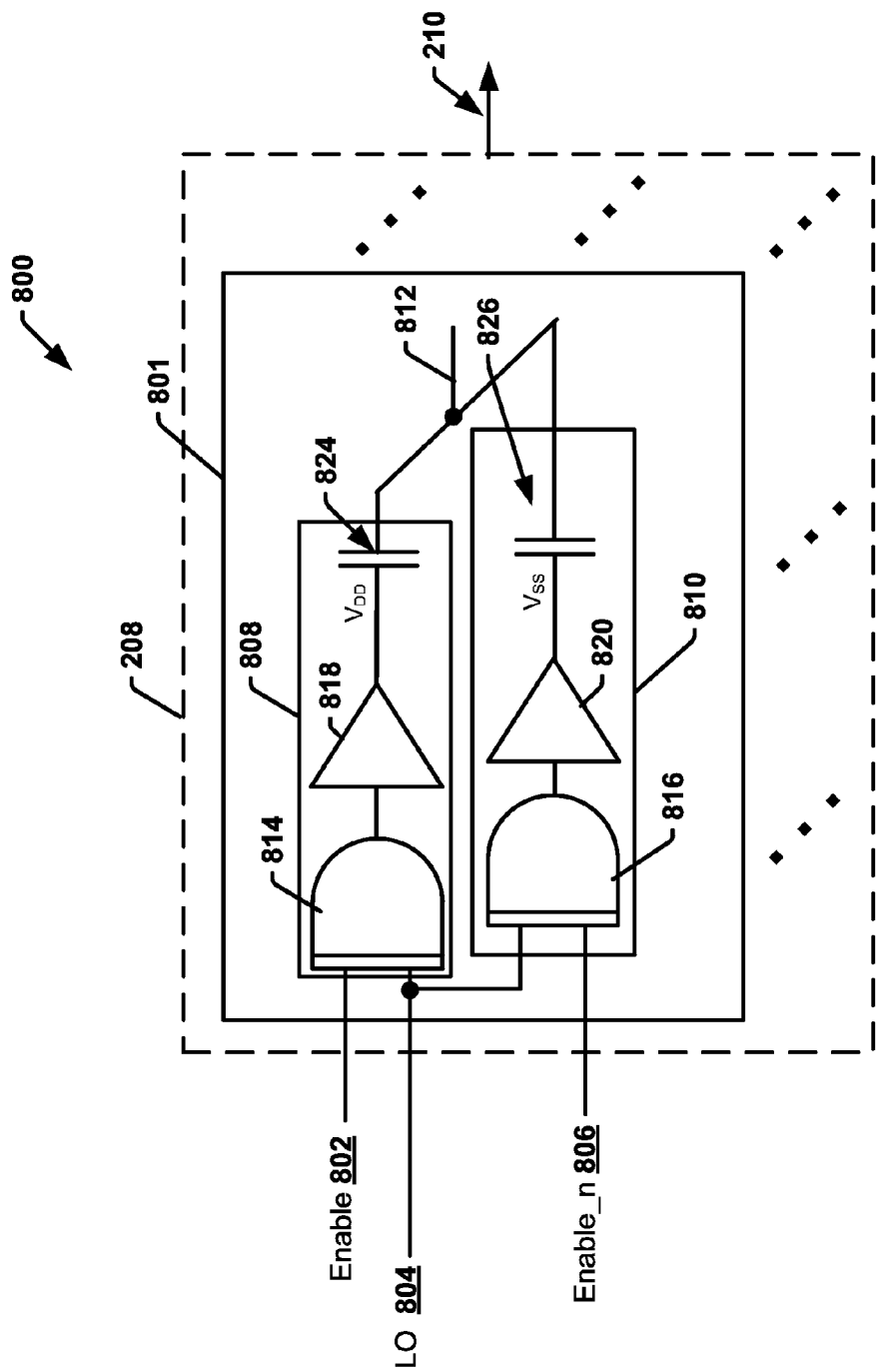
FIG. 8 illustrates another example of a source cell for a capacitive DAC system in accordance with various aspects of the systems described herein.

Referring to FIG. 8, illustrated is another example source cell 801 of the array of source cells 208 of a converter system 800 in accordance with various aspects. The source cell 801 is illustrated with symmetric inverter/driver chains as a first inverter/driver 818 and a second inverter/driver 820, which receive an enable signal 802 and a negated enable signal 806 to drive respective capacitors 824 and 826 for releasing first and second charge packets to the source cell output 812. The first signal branch 808 and the second signal branch respectively comprise a first logic device 814 and a second logic device 816 for providing control signals to the drivers 818 and 820 in response to the enable 802 or the inverted or negated enable signal 806, and a local oscillator signal 804, for example. In this manner, the source cell 801 is selected to generate two charge packages as a function of a received digital input signal of the system 800, which can further generate a sign operation by shifting the charge packages in time. Although symmetrical inverter/driver chains are illustrated, asymmetrical inverter/drive chains having different numbers of inverter(s)/driver(s) can also be utilized in each source cell of the array 208, which is illustrated supra.

Figure 9:
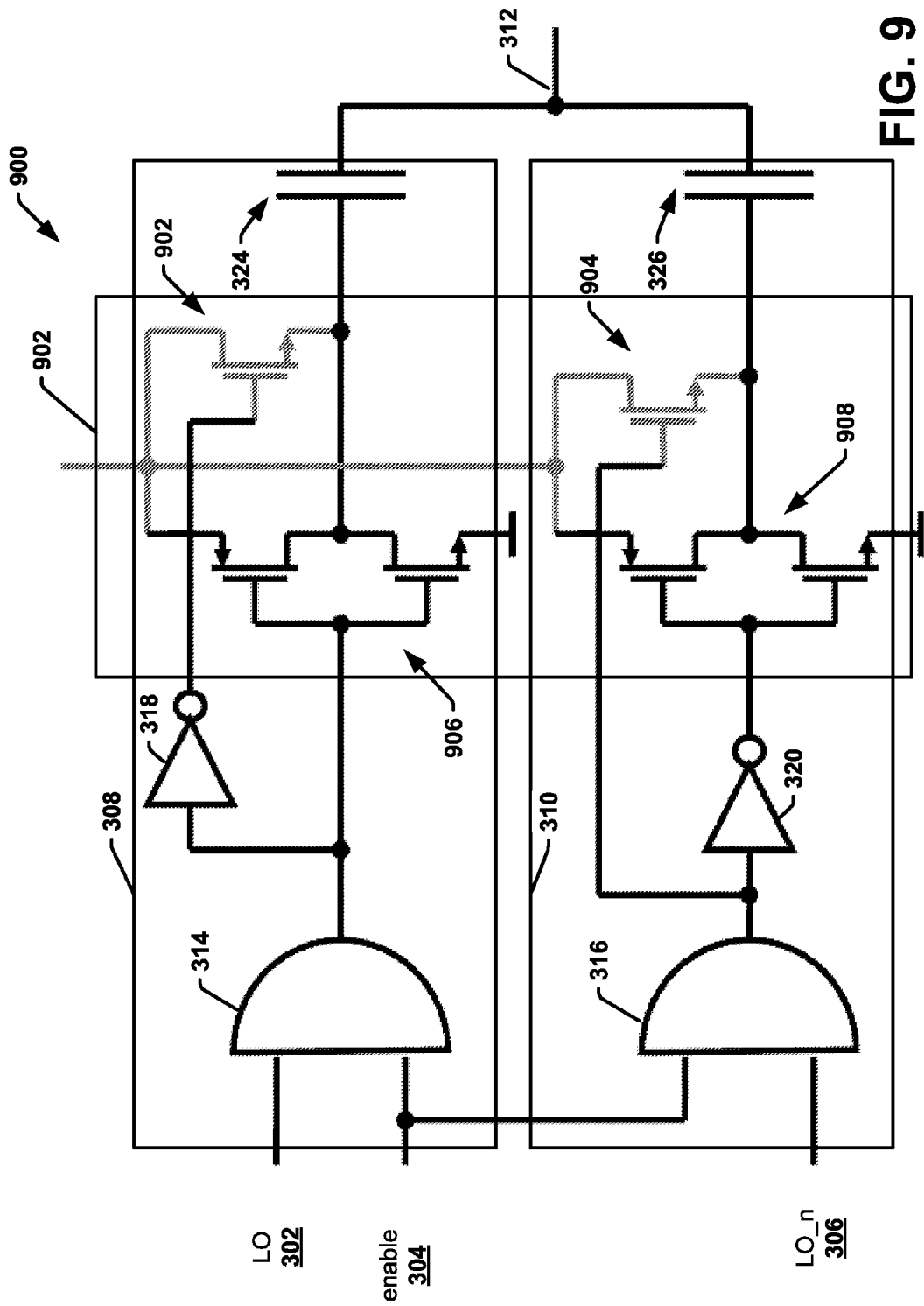
FIG. 9 illustrates another example of a source cell for a capacitive DAC system in accordance with various aspects of the systems described herein.

FIG. 9 illustrates another example of a source cell 900 in accordance with various aspects described. Similar to the source cell 300, the source cell 900 comprises the first signal branch 308 and the second signal branch 310, which operate to generate two charge packets when selected via an enable signal 304 and a local oscillator signal (LO 302 and negated LO 306). The source cell 900 can be a unit cell within an array of source cells (e.g., array 208), which comprises uniform cells or different source cell configurations according to various aspects discussed herein. The source cell 900 is different from the source cell 300 in that it comprises an output driver stage or output stage supply 902 that is configured to alter an output power of the source cell by changing a supply voltage to the first capacitor 324 and the second capacitor 326. As such, the source cell 900 operates and functions similar to the source cell 300 in the aspects described, but further operates to control power generate through the first and second branches 308, 310. The output stage supply 902 operates with a first set of transistors 906 and a second set of transistors 908 to change the supply voltage of a driving stage in respective branches 308 and 310, for example. An additional transistor 902 and 904 respectively, can comprise an N-channel transistor or another type transistor (e.g., P-type), for example. The additional transistor 902 and 904 operate to deliver a lower voltage to the output 312, for example, and thereby provide a wider range of frequency and power from each cell in the array to generate the analog signal output 312.

Figure 10:
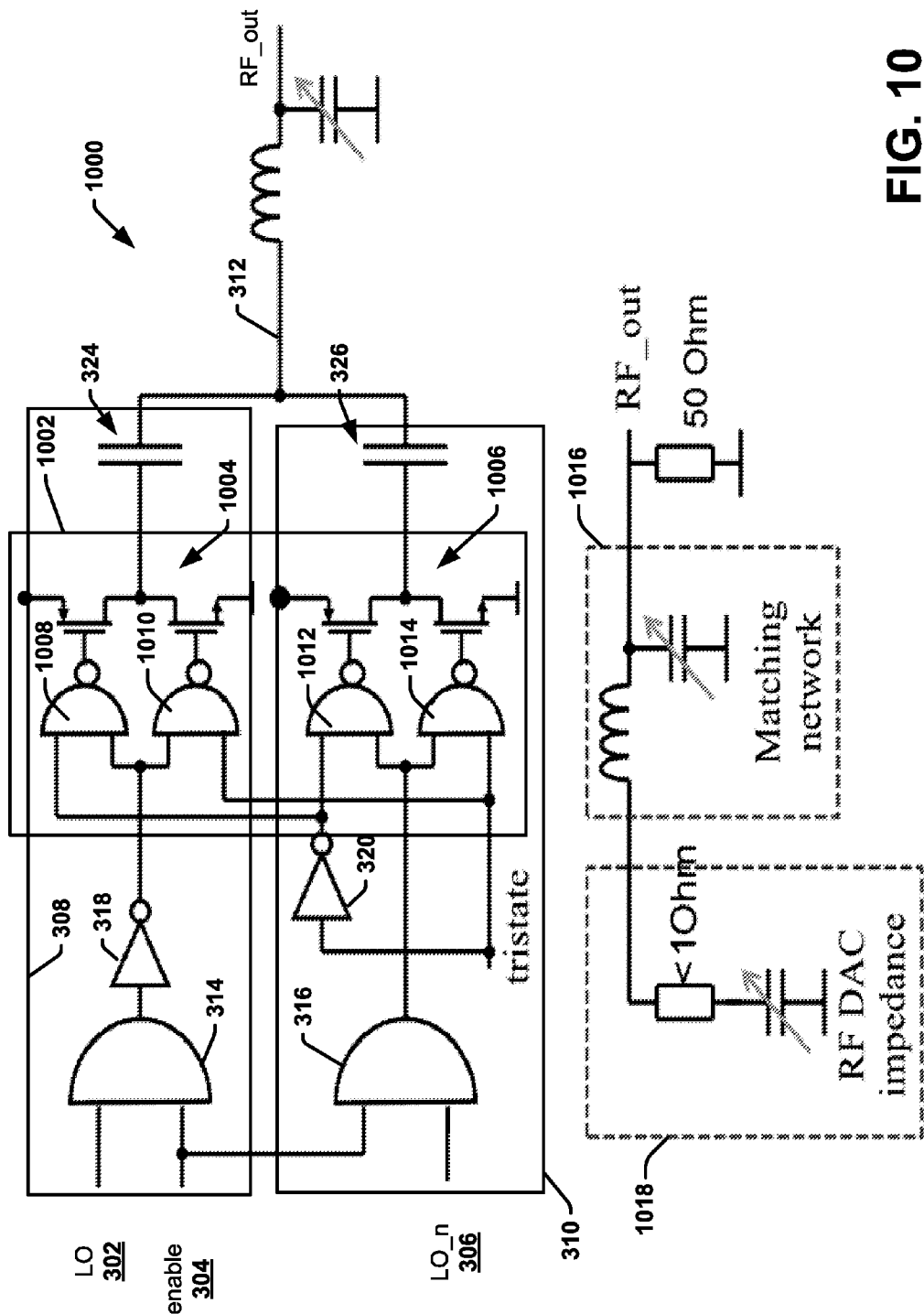
FIG. 10 illustrates another example of a source cell for a capacitive DAC system in accordance with various aspects of the systems described herein.

Referring now to FIG. 10, illustrated is another example source cell 1000 in accordance with various aspects described. The source cell 1000 is similar to the source cell of the array(s) of a DAC, as discussed above, and further comprises a tuning control component 1002 that operates to control a tuning of the impedance of a driver stage, for example.

The tuning component 1002 comprises a plurality of switches coupled respectively to the first signal branch 308 and the second signal branch 310. The first signal branch 308 comprises transistors 1004, for example, which can operate as switching devices as a function of a state of a first logic device 1008 and a second logic device 1010. The second signal branch 310 comprises transistors 1006, for example, which can operate as switching devices as a function of a state of a third logic device 1012 and a fourth logic device 1014.

The tuning component 1002 is configured to vary an output resistance to the first signal branch 308 and the second charge branch 310. The tuning component 1002 operates to tune the first capacitor 324 of the first signal branch 308 of the source cell 1000 and the second capacitor 326 of the second signal branch 310 of the source cell 1000 by changing an impedance of the driver stages (stages between the logic devices 314, 316 and the capacitors 324, 326) of the first signal branch 308 and the second signal branch 310.

The tuning component 1002 is further configured to increase an operational bandwidth of the source cell 1000 by facilitating a switch to a tri-state mode of operation that alters or sets an impedance of the source cell 1000 based on a state of the switches 1004, 1006. By facilitating the tri-state mode of operation for the DAC, the tuning component 1002 couples the source cell 1000 to an additional circuit load by coupling the source cell 1000 to an RF DAC impedance 1018 and a matching network 1016 that matches a load to an output of the source cell 1000 to maximize power transfer or minimize signal reflection from the load. Therefore, the output of the source at a particular frequency. The impedance and frequency of the DAC can be variable as a function of the tri-state mode of operation to match different output loads and different frequencies (e.g., 1.7 GHz, 2.1 GHz or other frequencies) depending upon the load or device demands coupled to the output (RF_out) of the source cell 1002. For example, for devices or loads demanding different frequencies, the tri-state mode can drive or set a different capacitance to the capacitors 324 and 326 through the matching network 1016 and the RF DAC impedance component 1018, which respectively comprise variable capacitors.

It should also be noted that various examples have been described and/or illustrated above using NMOS transistors, which are put to a conducting state between their sources and drains when a high voltage (e.g., logical 1) is supplied to their gates; and are put into a non-conducting state between their sources and drains when a low voltage (e.g., logical 0) is supplied to their gates. In another example, the control logic can be reversed, and PMOS transistors can be used. In still other examples, PMOS transistors can be used instead of NMOS transistors in cases where for example logical 1 is associated with a low voltage and logical 0 is associated with a high voltage. In still other examples, instead of some or all of the MOS transistors shown other types of transistors, for example bipolar transistors, can be used. For example, in case of bipolar transistors a base terminal serves as control terminal.

While the methods described within this disclosure are illustrated in and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 11:
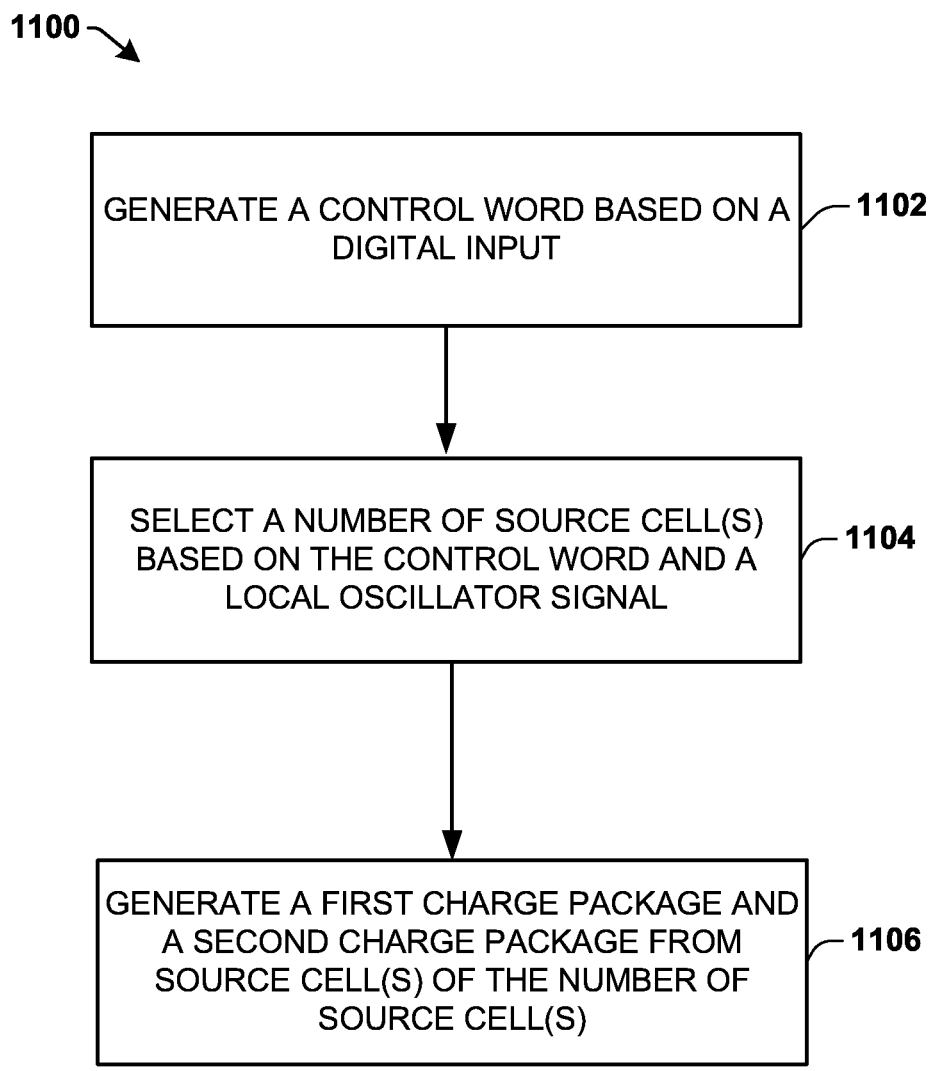
FIG. 11 illustrates a flow diagram of a method for a converter system accordance with various aspects described.

Referring to FIG. 11, illustrated is a method 1100 for a converter system such as a DAC system. At 1102, the method initiates with generating a control word based on a digital input word.

At 1104, the method comprises selecting a source cell of an array of source cells based on the control word and a local oscillator signal of a local oscillator. For example, the array of source cells 208 can be controlled to activate a select number (e.g., one or more source cells of the array) to generate a current source among first and second branches of each activated source cells. The number of activate cells can change in time depending upon the digital input word or a multi-bit digital input in order to generate a corresponding amplitude, for example.

At 1106, the method further comprises generating, via the source cell, a first charge package and a second charge package to an output terminal of the digital to analog converter.

In other embodiments of the method 1100, a bipolar sign operation of the first charge package and the second charge package is generated by shifting the first charge package and the second charge package in time, which formulates an indication of an inverted charge packages. The generation of the first charge package and the second charge package, for example, comprises generating a first driver current to a first capacitor of a first driver branch of the source cell and generating a second driver current to a second capacitor of a second driver branch of the source cell.

Figure 12:
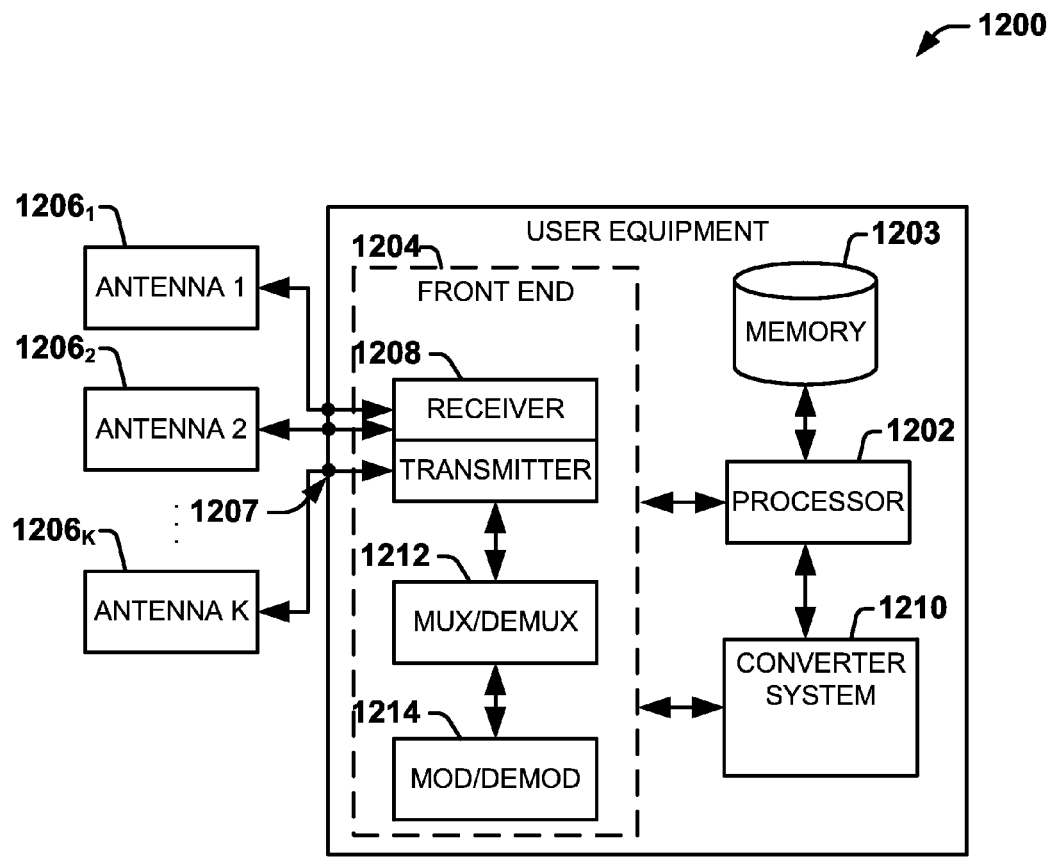
FIG. 12 illustrates an exemplary mobile communication device having a converter system in accordance with various aspects described.

To provide further context for various aspects of the disclosed subject matter, FIG. 12 illustrates a block diagram of an embodiment of access equipment, user equipment (e.g., a mobile device, communication device, personal digital assistant, etc.) or software 1200 related to access of a network (e.g., base station, wireless access point, femtocell access point, and so forth) that can enable and/or exploit features or aspects of the disclosed aspects.

The user equipment or mobile communication device 1200 can be utilized with one or more aspects of the converter systems or devices described according to various aspects herein. The mobile communication device 1200, for example, comprises a digital baseband processor 1202 that can be coupled to a data store or memory 1203, a front end 1204 (e.g., an RF front end, an acoustic front end, or the other like front end) and a plurality of antenna ports 1207 for connecting to a plurality of antennas $1206_1$ to $1206_k$ (k being a positive integer). The antennas $1206_1$ to $1206_k$ can receive and transmit signals to and from one or more wireless devices such as access points, access terminals, wireless ports, routers and so forth, which can operate within a radio access network or other communication network generated via a network device (not shown). The user equipment 1200 can be a radio frequency (RF) device for communicating RF signals, an acoustic device for communicating acoustic signals, or any other signal communication device, such as a computer, a personal digital assistant, a mobile phone or smart phone, a tablet PC, a modem, a notebook, a router, a switch, a repeater, a PC, network device, base station or a like device that can operate to communicate with a network or other device according to one or more different communication protocols or standards.

The front end 1204 can include a communication platform, which comprises electronic components and associated circuitry that provide for processing, manipulation or shaping of the received or transmitted signals via one or more receivers or transmitters 1208, a mux/demux component 1212, and a mod/demod component 1214. The front end 1204, for example, is coupled to the digital baseband processor 1202 and the set of antenna ports 1207, in which the set of antennas $1206_1$ to $1206_k$ can be part of the front end. In one aspect, the mobile communication device 1200 can comprise a converter system 1210 that operates to converter an input signal to an output signal of a different format with a plurality of source cells having a first signal branch and a second signal branch respective to generate two charge packages according to aspects disclosed herein.

The user equipment device 1200 can also include a processor 1202 or a controller that can operate to provide or control one or more components of the mobile device 1200. For example, the processor 1202 can confer functionality, at least in part, to substantially any electronic component within the mobile communication device 1200, in accordance with aspects of the disclosure. As an example, the processor can be configured to execute, at least in part, executable instructions that control various modes of the phase locked loop system 1210 as a multi-mode operation chipset that affords different power generation operations for input signals at the antenna ports 1207, an input terminal or other terminal based on one or more characteristics of the converter system 1210.

The processor 1202 can operate to enable the mobile communication device 1200 to process data (e.g., symbols, bits, or chips) for multiplexing/demultiplexing with the mux/demux component 1212, or modulation/demodulation via the mod/demod component 1214, such as implementing direct and inverse fast Fourier transforms, selection of modulation rates, selection of data packet formats, inter-packet times, etc. Memory 1203 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation.

The processor 1202 is functionally and/or communicatively coupled (e.g., through a memory bus) to memory 1203 in order to store or retrieve information necessary to operate and confer functionality, at least in part, to communication platform or front end 1204, the converter system 1210 (e.g., an ADC converter system) and substantially any other operational aspects of the converter system 1210.

Examples herein can include subject matter such as a method, means for performing acts or blocks of the method, at least one machine-readable medium including executable instructions that, when performed by a machine (e.g., a processor with memory or the like) cause the machine to perform acts of the method or of an apparatus or system for concurrent communication using multiple communication technologies according to embodiments and examples described.

Example 1 is a communication system, comprising an input terminal configured to receive an input signal, a converter comprising an array of source cells configured to generate an output at an output terminal, and a decoding component configured to generate a control signal that selectively activates at least one source cell of the array of source cells to generate the output based on the input signal, wherein a source cell of the at least one source cell is configured to generate a first charge package and a second charge package corresponding to a data cycle.

Example 2 includes the subject matter of Example 1, wherein the source cell comprises a first capacitor and a second capacitor coupled to a cell output terminal, the first capacitor configured to generate the first charge package and the second capacitor configured to generate the second charge package.

Example 3 includes the subject matter of any of Examples 1 and 2, including or omitting optional elements, further comprising a local oscillator configured to generate a local oscillator signal as the data cycle to generate the output at the output terminal, wherein the at least one source cell comprises a corresponding cell output terminal selectively coupled to the output terminal based on the control signal.

Example 4 includes the subject matter of any of Examples 1-3, including or omitting optional elements, further comprising a sign component configured to generate a bipolar sign operation with the output via the source cell by shifting the first charge package and the second charge package as a function of time.

Example 5 includes the subject matter of any of Examples 1-4, including or omitting optional elements, wherein the source cell comprises a first signal branch driven by a clock signal of a local oscillator and a second signal branch driven by an inverted clock signal of the local oscillator.

Example 6 includes the subject matter of any of Examples 1-5, including or omitting optional elements, wherein the first signal branch comprises a first driver component and a first capacitor configured to generate the first charge package and the second signal branch comprises a second driver component and a second capacitor configured to generate the second charge package.

Example 7 includes the subject matter of any of Examples 1-6, including or omitting optional elements, wherein the first signal branch is configured to generate the first charge package at a cell output terminal in response to a first edge of a local oscillator signal and the second signal branch is configured to generate the second charge package at the cell output terminal in response to a second edge of the local oscillator signal that is opposite to the first edge.

Example 8 includes the subject matter of any of Examples 1-7, including or omitting optional elements, wherein the source cell is further configured to alter an output power of the source cell by changing a supply voltage to a first capacitor and a second capacitor, and increase an operational bandwidth by switching to a tri-state mode of operation by altering an impedance of the source cell based on a state of a set of switches.

Example 9 is a digital to analog converter comprising a digital input terminal configured to receive a digital input word, an array of source cells that comprise: a cell output terminal; a first charge branch configured to provide a first charge source to the cell output terminal during a clock cycle; and a second charge branch configured to provide a second charge source to the cell output terminal during the clock cycle. A decoder component configured to generate a control word based on a digital input and selectively couple and activate at least one source cell of the array of source cells to an output terminal based on the control word.

Example 10 includes the subject matter of Example 9 wherein the decoder component is further configured to generate a first cell output and a second cell output at the cell output terminal of the at least one source cell, wherein the first cell output is inverted with respect to the second cell output.

Example 11 includes the subject matter of any of Examples 9 or 10, including or omitting option elements, wherein the decoder component is configured to generate a first sign operation via the first charge branch and the second charge branch of the at least one source cell, and generate a second sign operation that is different than the first sign operation via the first charge branch and the second charge branch based on a shift in time of the first charge source and the second charge source.

Example 12 includes the subject matter of any of Examples 9-11, including or omitting option elements, wherein the first charge branch comprises a first capacitor coupled to a positive supply voltage and the second charge branch comprise a second capacitor coupled to a negative supply voltage.

Example 13 includes the subject matter of any of Examples 9-12, including or omitting option elements, wherein the first charge branch and the second charge branch comprise an output stage supply component configured to alter a supply voltage to a first capacitor of the first charge branch and a second capacitor of the second charge branch.

Example 14 includes the subject matter of any of Examples 9-13, including or omitting option elements, further comprising a tuning component configured to tune a first capacitor of the first charge branch and a second capacitor of the second charge branch by changing an impedance of a driver stage of the first charge branch and the second charge branch.

Example 15 includes the subject matter of any of Examples 9-14, including or omitting option elements, wherein the first charge branch is configured to generate the first charge source at a first local oscillator edge and the second charge branch is configured to generate the second charge source at second oscillator edge that comprises an opposite polarity than the first local oscillator edge.

Example 16 includes the subject matter of any of Examples 9-15, including or omitting option elements, further comprising a tuning component configured to increase a bandwidth range of the array of source cells by changing an impedance of a driver stage of the first charge branch and the second charge branch.

Example 17 includes the subject matter of any of Examples 9-16, including or omitting option elements, wherein the first charge branch comprises a first capacitor having a first capacitance and the second charge branch comprises a second capacitor having a second capacitance that is substantially equal to the first capacitance.

Example 18 is a method of a digital to analog converter comprising generating a control word based on a digital input word; selecting a source cell of an array of source cells based on the control word and a local oscillator signal of a local oscillator; and generating, via the source cell, a first charge package and a second charge package to an output terminal of the digital to analog converter.

Example 19 includes the subject matter of Example 18 further comprising generating a bipolar sign operation of the first charge package and the second charge package by shifting the first charge package and the second charge package in time.

Example 20 includes the subject matter of any of Examples 18 or 19, including or omitting option elements, wherein the generating the first charge package and the second charge package comprises generating a first driver current to a first capacitor of a first driver branch of the source cell and generating a second driver current to a second capacitor of a second driver branch of the source cell.

Example 21 includes the subject matter of any of Examples 18-20, including or omitting option elements, wherein generating the first charge package and the second charge package comprises generating the first charge package in response to a first edge of the local oscillator signal and generating the second charge package in response to a second edge of the local oscillator signal that is opposite to the second edge and is a part of a same period of the local oscillator signal.

Example 22 includes the subject matter of any of Examples 18-21, including or omitting option elements, further comprising activating a different source cell of the array of source cells based on a change in the digital input word; and generating at least two packages of charge within one data cycle of the different source cell.

Example 23 includes the subject matter of any of Examples 18-22, including or omitting option elements, further comprising inverting a sign of the first charge package and the second charge package by shifting the first charge package and the second charge package in time.

Example 24 includes the subject matter of any of Examples 18-23, including or omitting option elements, further comprising tuning a first capacitor of a first driver branch of the source cell and a second capacitor of a second driver branch of the source cell by changing an impedance of a driver stage of the first driver branch and the second driver branch.

Applications (e.g., program modules) can include routines, programs, components, data structures, etc., that perform particular tasks or implement particular abstract data types. Moreover, those skilled in the art will appreciate that the operations disclosed can be practiced with other system configurations, including single-processor or multiprocessor systems, minicomputers, mainframe computers, as well as personal computers, hand-held computing devices, microprocessor-based or programmable consumer electronics, and the like, each of which can be operatively coupled to one or more associated devices.

A computing device can typically include a variety of computer-readable media. Computer readable media can be any available media that can be accessed by the computer and includes both volatile and non-volatile media, removable and non-removable media. By way of example and not limitation, computer-readable media can comprise computer storage media and communication media. Computer storage media includes volatile and non-volatile, removable and non-removable media implemented in any method or technology for storage of information such as computer-readable instructions, data structures, program modules or other data. Computer storage media (e.g., one or more data stores) can include, but is not limited to, RAM, ROM, EEPROM, flash memory or other memory technology, CD ROM, digital versatile disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

It is to be understood that aspects described herein may be implemented by hardware, software, firmware, or any combination thereof. When implemented in software, functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Various illustrative logics, logical blocks, modules, and circuits described in connection with aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor may be a microprocessor, but, in the alternative, processor may be any conventional processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration. Additionally, at least one processor may comprise one or more modules operable to perform one or more of the acts and/or actions described herein.

For a software implementation, techniques described herein may be implemented with modules (e.g., procedures, functions, and so on) that perform functions described herein. Software codes may be stored in memory units and executed by processors. Memory unit may be implemented within processor or external to processor, in which case memory unit can be communicatively coupled to processor through various means as is known in the art. Further, at least one processor may include one or more modules operable to perform functions described herein.

Moreover, various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical discs (e.g., compact disc (CD), digital versatile disc (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data. Additionally, a computer program product may include a computer readable medium having one or more instructions or codes operable to cause a computer to perform functions described herein.

Further, the acts and/or actions of a method or algorithm described in connection with aspects disclosed herein may be embodied directly in hardware, in a software module executed by a processor, or a combination thereof. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to processor, such that processor can read information from, and write information to, storage medium. In the alternative, storage medium may be integral to processor. Further, in some aspects, processor and storage medium may reside in an ASIC. Additionally, ASIC may reside in a user terminal. In the alternative, processor and storage medium may reside as discrete components in a user terminal. Additionally, in some aspects, the acts and/or actions of a method or algorithm may reside as one or any combination or set of codes and/or instructions on a machine-readable medium and/or computer readable medium, which may be incorporated into a computer program product.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature may be combined with one or more other features of the other implementations as may be desired and advantageous for any given or particular application.

What is claimed is:

1. A communication system comprising:
    an input terminal configured to receive an input signal;
    a converter comprising an array of source cells configured to generate an output at an output terminal; and
    a decoding component configured to generate a control signal that selectively activates at least one source cell of the array of source cells to generate the output based on the input signal;
    wherein the at least one source cell is configured to generate a first charge package and a second charge package corresponding to a data cycle, and the at least one source cell further comprises a first capacitor and a second capacitor coupled to a cell output terminal, the first capacitor configured to generate the first charge package and the second capacitor configured to generate the second charge package.

2. The communication system of claim 1, further comprising:
    a local oscillator configured to generate a local oscillator signal as the data cycle to generate the output at the output terminal, wherein the at least one source cell comprises a corresponding cell output terminal selectively coupled to the output terminal based on the control signal.

3. The communication system of claim 1, wherein the source cell comprises a first signal branch driven by a clock signal of a local oscillator and a second signal branch driven by an inverted clock signal of the local oscillator.

4. The communication system of claim 3, wherein the first signal branch comprises a first driver component and the first capacitor configured to generate the first charge package and the second signal branch comprises a second driver component and the second capacitor configured to generate the second charge package.

5. The communication system of claim 3, wherein the first signal branch is configured to generate the first charge package at a cell output terminal in response to a first edge of a local oscillator signal and the second signal branch is configured to generate the second charge package at the cell output terminal in response to a second edge of the local oscillator signal that is opposite to the first edge.

6. The communication system of claim 1, wherein the source cell is further configured to alter an output power of the source cell by changing a supply voltage to the first capacitor and the second capacitor, and increase an operational bandwidth by switching to a tri-state mode of operation by altering an impedance of the source cell based on a state of a set of switches.

7. A communication system comprising:
an input terminal configured to receive an input signal;
a converter comprising an array of source cells configured to generate an output at an output terminal;
a decoding component configured to generate a control signal that selectively activates at least one source cell of the array of source cells to generate the output based on the input signal, wherein a source cell of the at least one source cell is configured to generate a first charge package and a second charge package corresponding to a data cycle; and
a sign component configured to generate a bipolar sign operation with the output via the source cell by shifting the first charge package and the second charge package as a function of time.

8. A digital to analog converter comprising:
a digital input terminal configured to receive a digital input word;
an array of source cells that comprise:
a cell output terminal;
a first charge branch configured to provide a first charge source to the cell output terminal during a clock cycle; and
a second charge branch configured to provide a second charge source to the cell output terminal during the clock cycle;
wherein the first charge branch comprises a first capacitor coupled to a positive supply voltage and the second charge branch comprise a second capacitor coupled to a negative supply voltage; and
a decoder component configured to generate a control word based on a digital input and selectively couple and activate at least one source cell of the array of source cells to an output terminal based on the control word.

9. The digital to analog converter of claim 8, wherein the decoder component is further configured to generate a first cell output and a second cell output at the cell output terminal of the at least one source cell, wherein the first cell output is inverted with respect to the second cell output.

10. The digital to analog converter of claim 8, wherein the decoder component is configured to generate a first sign operation via the first charge branch and the second charge branch of the at least one source cell, and generate a second sign operation that is different than the first sign operation via the first charge branch and the second charge branch based on a shift in time of the first charge source and the second charge source.

11. The digital to analog converter of claim 8, wherein the first charge branch and the second charge branch comprise an output stage supply component configured to alter a supply voltage to the first capacitor of the first charge branch and the second capacitor of the second charge branch.

12. The digital to analog converter of claim 8, further comprising a tuning component configured to tune the first capacitor of the first charge branch and the second capacitor of the second charge branch by changing an impedance of a driver stage of the first charge branch and the second charge branch.

13. The digital to analog converter of claim 8, wherein the first charge branch is configured to generate the first charge source at a first local oscillator edge and the second charge branch is configured to generate the second charge source at second oscillator edge that comprises an opposite polarity than the first local oscillator edge.

14. A digital to analog converter comprising:
a digital input terminal configured to receive a digital input word;
an array of source cells that comprise:
a cell output terminal;
a first charge branch configured to provide a first charge source to the cell output terminal during a clock cycle; and
a second charge branch configured to provide a second charge source to the cell output terminal during the clock cycle;
a decoder component configured to generate a control word based on a digital input and selectively couple and activate at least one source cell of the array of source cells to an output terminal based on the control word; and
a tuning component configured to increase a bandwidth range of the array of source cells by changing an impedance of a driver stage of the first charge branch and the second charge branch.

15. A digital to analog converter comprising:
a digital input terminal configured to receive a digital input word;
an array of source cells that comprise:
a cell output terminal;
a first charge branch configured to provide a first charge source to the cell output terminal during a clock cycle;
a second charge branch configured to provide a second charge source to the cell output terminal during the clock cycle, wherein the first charge branch comprises a first capacitor having a first capacitance and the second charge branch comprises a second capacitor having a second capacitance that is substantially equal to the first capacitance; and
a decoder component configured to generate a control word based on a digital input and selectively couple and activate at least one source cell of the array of source cells to an output terminal based on the control word.

16. A method of a digital to analog converter comprising:
generating a control word based on a digital input word;
selecting a source cell of an array of source cells based on the control word and a local oscillator signal of a local oscillator;
generating, via the source cell, a first charge package and a second charge package to an output terminal of the digital to analog converter; and
generating a bipolar sign operation of the first charge package and the second charge package by shifting the first charge package and the second charge package in time.

17. The method of claim 16, wherein the generating the first charge package and the second charge package comprises generating a first driver current to a first capacitor of a first driver branch of the source cell and generating a second driver current to a second capacitor of a second driver branch of the source cell.

18. The method of claim 16, wherein generating the first charge package and the second charge package comprises generating the first charge package in response to a first edge of the local oscillator signal and generating the second charge package in response to a second edge of the local oscillator signal that is opposite to the second edge and is a part of a same period of the local oscillator signal.

19. The method of claim 16, further comprising:
activating a different source cell of the array of source cells based on a change in the digital input word; and
generating at least two packages of charge within one data cycle of the different source cell.

20. The method of claim 16, further comprising:
inverting a sign of the first charge package and the second charge package by shifting the first charge package and the second charge package in time.

21. The method of claim 16, further comprising:
tuning a first capacitor of a first driver branch of the source cell and a second capacitor of a second driver branch of the source cell by changing an impedance of a driver stage of the first driver branch and the second driver branch.

* * * * *